United States Patent
Kim et al.

(10) Patent No.: US 10,255,150 B2
(45) Date of Patent: Apr. 9, 2019

(54) MULTICHIP DEBUGGING METHOD AND MULTICHIP SYSTEM ADOPTING THE SAME

(71) Applicant: SAMSUNG ELECTRONICS CO., LTD., Suwon-si (KR)

(72) Inventors: Jong-min Kim, Incheon (KR); Chan-ho Yoon, Seoul (KR); Jung-pil Lee, Hwaseong-si (KR); Hyung-joon Park, Hwaseong-si (KR); Jae-ho Sim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 81 days.

(21) Appl. No.: 15/378,871

(22) Filed: Dec. 14, 2016

(65) Prior Publication Data

US 2017/0168910 A1    Jun. 15, 2017

(30) Foreign Application Priority Data

Dec. 14, 2015    (KR) .......................... 10-2015-0178509

(51) Int. Cl.
| | |
|---|---|
| *G06F 11/00* | (2006.01) |
| *G06F 11/22* | (2006.01) |
| *G06F 11/36* | (2006.01) |
| *G06F 11/273* | (2006.01) |
| *G06F 11/07* | (2006.01) |
| *H01L 23/544* | (2006.01) |

(52) U.S. Cl.
CPC ........ *G06F 11/2215* (2013.01); *G06F 11/079* (2013.01); *G06F 11/273* (2013.01); *G06F 11/2733* (2013.01); *G06F 11/3656* (2013.01); *H01L 23/544* (2013.01); *H01L 2223/54433* (2013.01); *H01L 2223/54446* (2013.01)

(58) Field of Classification Search
CPC . G06F 11/2733; G06F 11/273; G06F 11/3656
See application file for complete search history.

(56) References Cited

U.S. PATENT DOCUMENTS

| | | | |
|---|---|---|---|
| 6,848,068 B1 | 1/2005 | Liu | |
| 7,036,058 B1 | 4/2006 | Miyachi et al. | |
| 7,131,033 B1 | 10/2006 | Roper et al. | |
| 7,467,341 B2 | 12/2008 | Sato | |
| 7,665,002 B1 * | 2/2010 | White | G01R 31/31705 714/727 |
| 7,818,640 B1 | 10/2010 | Lerner | |
| 7,870,455 B2 | 1/2011 | Mayer | |

(Continued)

FOREIGN PATENT DOCUMENTS

| | | | |
|---|---|---|---|
| JP | 2005-274342 A | 10/2005 | |
| JP | 2012-211889 A | 11/2012 | |

(Continued)

*Primary Examiner* — Charles Ehne
(74) *Attorney, Agent, or Firm* — Sughrue Mion, PLLC

(57) ABSTRACT

Provided are a multichip debugging method and a multichip system adopting the same. The multichip system includes: a first chip including a first debugging port and first identification (ID) information, a second chip including a second debugging port and second ID information, and a test access port (TAP) electrically connected to the first debugging port and the second debugging port and configured to connect to a test apparatus via the TAP.

15 Claims, 15 Drawing Sheets

(56) References Cited

U.S. PATENT DOCUMENTS

| | | |
|---|---|---|
| 7,900,110 B2 | 3/2011 | Whetsel |
| 7,917,819 B2 | 3/2011 | Talayssat et al. |
| 2010/0263043 A1* | 10/2010 | Xu .......................... G06F 11/26 726/17 |
| 2012/0131403 A1 | 5/2012 | Chin et al. |
| 2013/0090887 A1* | 4/2013 | Deogharia ..... G01R 31/318555 702/120 |
| 2013/0339790 A1* | 12/2013 | Menon .................... G06F 11/27 714/30 |
| 2015/0127983 A1* | 5/2015 | Trobough ........... G06F 11/2733 714/30 |

FOREIGN PATENT DOCUMENTS

| | | |
|---|---|---|
| KR | 10-0204565 B1 | 6/1999 |
| KR | 10-2010-0076445 A | 7/2010 |

\* cited by examiner

MULTICHIP DEBUGGING METHOD AND MULTICHIP SYSTEM ADOPTING THE SAME

CROSS-REFERENCE TO RELATED APPLICATION

This application claims priority from Korean Patent Application No. 10-2015-0178509, filed on Dec. 14, 2015, in the Korean Intellectual Property Office, the entire disclosure of which is incorporated herein by reference.

BACKGROUND

Methods and apparatuses consistent with example embodiments relate to a debugging system and method, and more particularly, to a multichip debugging method and a multichip system adopting the same.

Generally, separate debugging pin ports are connected to each chip of a semiconductor chip, and debugging pin ports are arranged on a printed circuit board (PCB) to enable debugging of the semiconductor chip. However, in a system including more than one chip, a large amount of resources may be required in providing debugging pin ports on the PCB for each of the chips.

SUMMARY

At least one example embodiment provides a multichip system configured to debug multi-chips by using a test access port.

Further, at least one example embodiment provides a multichip debugging method of debugging multi-chips by using a test access port.

According to an aspect of an example embodiment, there is provided a multichip system including: a first chip including a first debugging port and first identification (ID) information; a second chip including a second debugging port and second ID information; and a test access port (TAP) electrically connected to the first debugging port and the second debugging port, and configured to connect to a test apparatus via the TAP, the first chip and the second chip being configured to perform a debugging process based on a multi-drop method.

According to an aspect of another example embodiment, there is provided a multichip debugging method including: allocating first identification (ID) information to a first chip of a plurality of chips arranged on a printed circuit board (PCB) and second ID information to a second chip of the plurality of chips; receiving target chip ID information via a test access port (TAP) connected to a first debugging port of the first chip and a second debugging port of the second chip; selecting one among the first chip and the second chip as a target chip to be tested based on the received target chip ID information; and performing a debugging process on the selected target chip.

According to an aspect of yet another example embodiment, there is provided a chip including: a debugging port configured to communicate with a test apparatus; and a processor configured to compare ID information received via the debugging port with ID information identifying the chip, determine whether the received ID information indicates the chip based on the comparison, and control the chip to perform a debugging operation based on the determining.

BRIEF DESCRIPTION OF THE DRAWINGS

The above and/or other aspects will become apparent and more clearly understood from the following detailed description of example embodiments, taken in conjunction with the accompanying drawings in which.

DETAILED DESCRIPTION OF EXAMPLE EMBODIMENTS

Example embodiments will now be described more fully with reference to the accompanying drawings.

Figure 1:
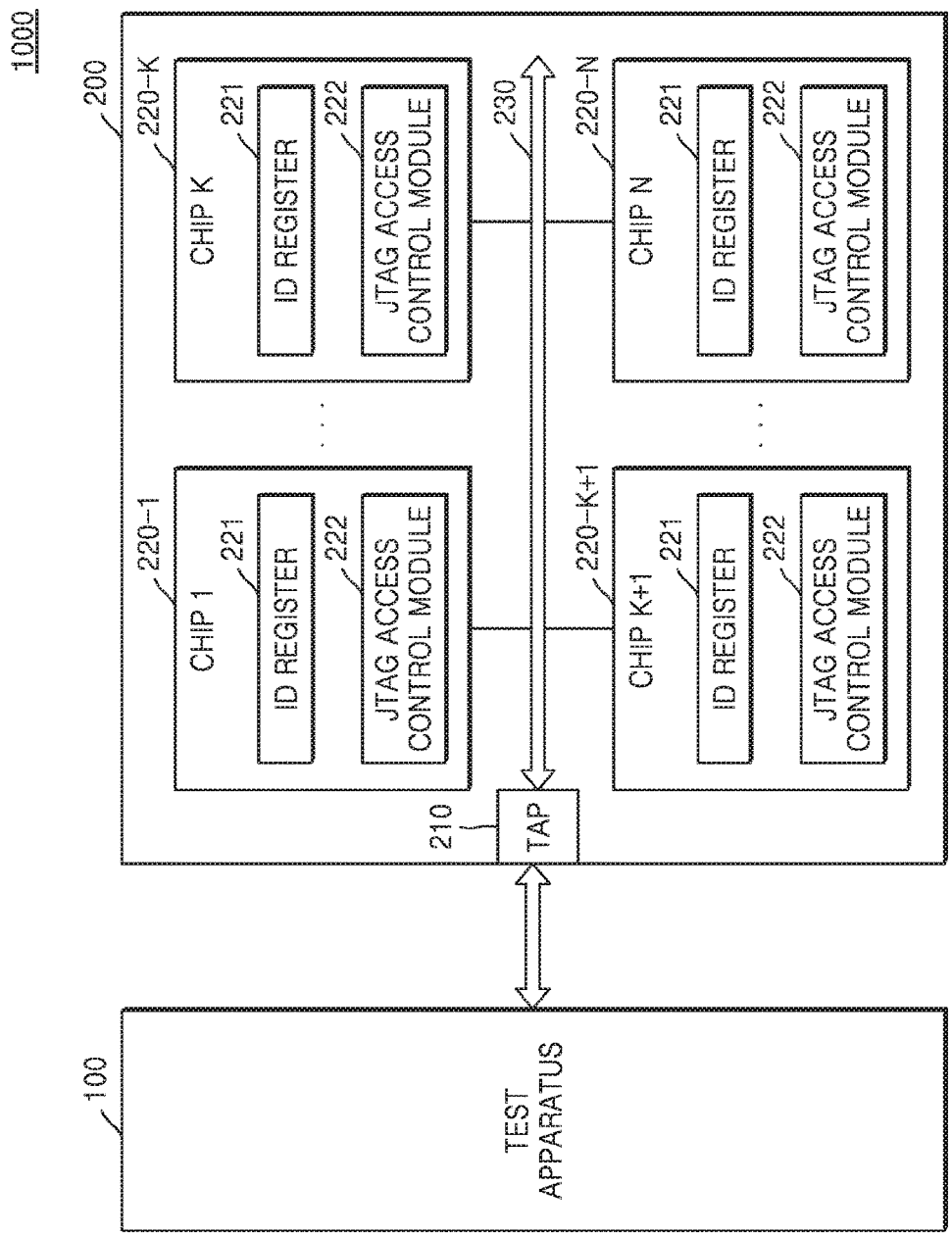
FIG. 1 illustrates a configuration of a multichip debugging system according to an example embodiment.

FIG. 1 illustrates a configuration of a multichip debugging system 1000 according to an example embodiment.

As shown in FIG. 1, the multichip debugging system 1000 includes a test apparatus 100 and a multichip system 200.

The test apparatus 100 includes hardware and software for testing chips 220-1 through 220-N included in the multichip system 200. As an example, the test apparatus 100 may debug the chips 220-1 through 220-N included in the multichip system 200 based on a joint test action group (JTAG) protocol. The test apparatus 100 may respectively debug each of the chips 220-1 through 220-N included in the multichip system 200. Additionally, the test apparatus 100 may respectively debug function blocks included in each of the chips 220-1 through 220-N included in the multichip system 200. Additionally, the test apparatus 100 may debug connections between devices included in the chips 220-1 through 220-N of the multichip system 200.

The test apparatus 100 connects to a test access port (TAP) 210 of the multichip system 200, and may perform a debugging operation via a data input/output terminal and a clock terminal included in the TAP 210.

The test apparatus 100 may generate a test procedure for testing the chips 220-1 through 220-N included in the multichip system 200. The test procedure specifies information needed to test the chips 220-1 through 220-N included in the multichip system 200. As an example, the test procedure may specify a description for testing each of the chips 220-1 through 220-N included in the multichip system 200. The test procedure may specify input test data and data expected to be output.

The test apparatus 100 may perform test and debugging operations on each chip by using identification (ID) information provided to each of the chips 220-1 through 220-N included in the multichip system 200.

The multichip system 200 includes the TAP 210, a plurality of the chips 220-1 through 220-N, and a bus 230.

The TAP 210 includes terminals connected to the test apparatus 100 so as to transceive a signal with the test apparatus 100. As an example, the TAP 210 may include a data input/output terminal and a clock terminal which are based on a serial wired JTAG protocol.

Each of the plurality of chips 220-1 through 220-N may respectively include various function blocks. As an example, the plurality of chips 220-1 through 220-N may be configured as a system on chip (SoC). Each of the plurality of chips 220-1 through 220-N may respectively include a storage device. The plurality of chips 220-1 through 220-N may be arranged on a single printed circuit board (PCB) or a plurality of PCBs.

As an example, each of the plurality of chips 220-1 through 220-N may include an ID information port. As an example, ID information may be provided to an ID information port respectively included in each of the plurality of chips 220-1 through 220-N, by using a circuit included in the PCB. As an example, in providing a unique ID information to the ID information ports of the plurality of chips 220-1 through 220-N, the circuit in the PCB is configured to pull up or pull down corresponding to terminals included in the ID information ports.

As another example, the plurality of chips 220-1 through 220-N may program ID information by using at least one of a programmable fuse and an erasable programmable read only memory (EPROM).

Each of the plurality of chips 220-1 through 220-N includes an ID register 221 and a JTAG access control module 222.

Unique ID information provided to each chip, as described above, is stored in the ID register 221. Additionally, the JTAG access control module 222 includes hardware or software for controlling elements of a chip to be accessed if target ID information received from the test apparatus 100 via the TAP 210 is identical to ID information stored in the ID register 221 included in each chip, and controlling elements of a chip not to be accessed if the target ID information is not identical to the ID information.

If target ID information received from the test apparatus 100 via the TAP 210 based on an operation by the JTAG access control module 222 is identical to ID information stored in the ID register 221 included in each chip, test data received from the test apparatus 100 is processed by elements of each chip and the processed test data is output to the test apparatus 100 via the TAP 210.

Figure 2:
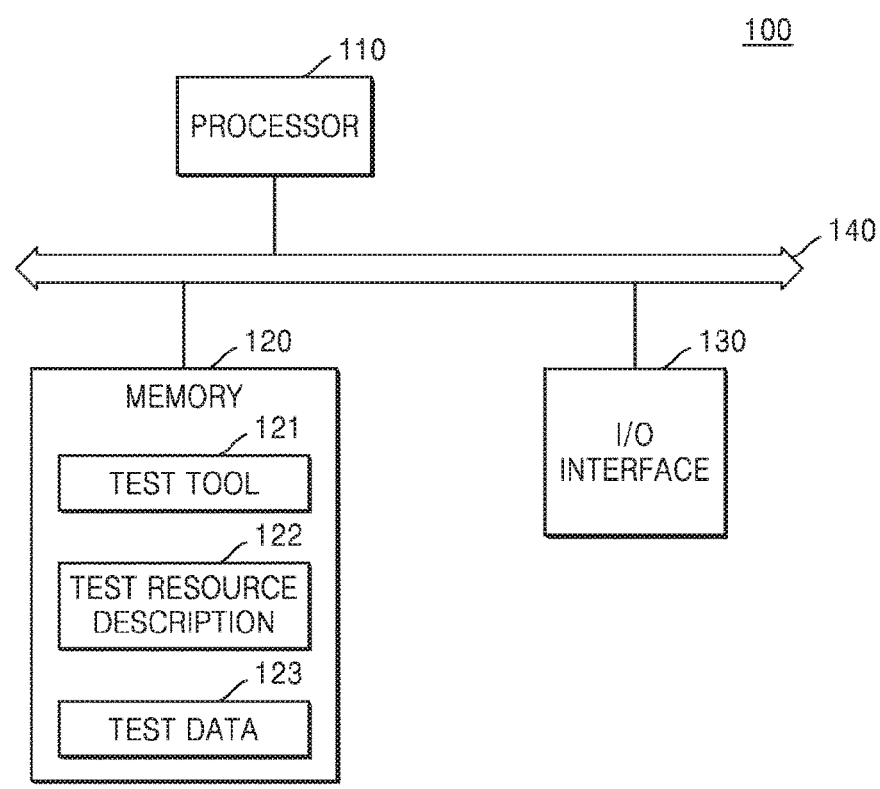
FIG. 2 illustrates a test apparatus according to an example embodiment.

FIG. 2 illustrates an example of a detailed configuration of the test apparatus 100 shown in FIG. 1.

As shown in FIG. 2, the test apparatus 100 includes a processor 110, a memory 120, an input/output (I/O) interface 130, and a bus 140.

The processor 110, the memory 120, and the I/O interface 130 are connected to the bus 140, and may tranceive data or a signal via the bus 140.

The processor 110 may include a circuit or a program code for controlling operations of elements according to a test function. As an example, the processor 110 may include a central processing unit (CPU), an advanced reduced instruction set computer machine (ARM), or an application specific integrated circuit (ASIC).

A test tool 121, a test resource description 122, and test data 123 are stored in the memory 120.

The test tool 121 includes program codes for controlling the test apparatus 100 to debug the multichip system 200 based on a JTAG protocol. As an example, the test tool 121 may perform one or more test procedures. A test procedure may be generated by one or more test compilers.

The test resource description 122 includes a description needed to test and debug each of the chips 220-1 through 220-N included in the multichip system 200. As an example, the test resource description 122 may include one or more libraries for performing different types of test and performing a debugging operation.

The test data 123 includes data used to debug the multichip system 200. As an example, the test data 123 may include input bitstream data, or bitstream data expected to be output.

The I/O interface 130 interfaces with the multichip system 200 to be tested. As an example, the I/O interface 130 may interface with the multichip system 200 based on a JTAG protocol.

The processor 110 may perform a series of operations for testing and debugging the multichip system 200 by using the test tool 121, the test resource description 122, and the test data stored in the memory 120.

Figure 3:
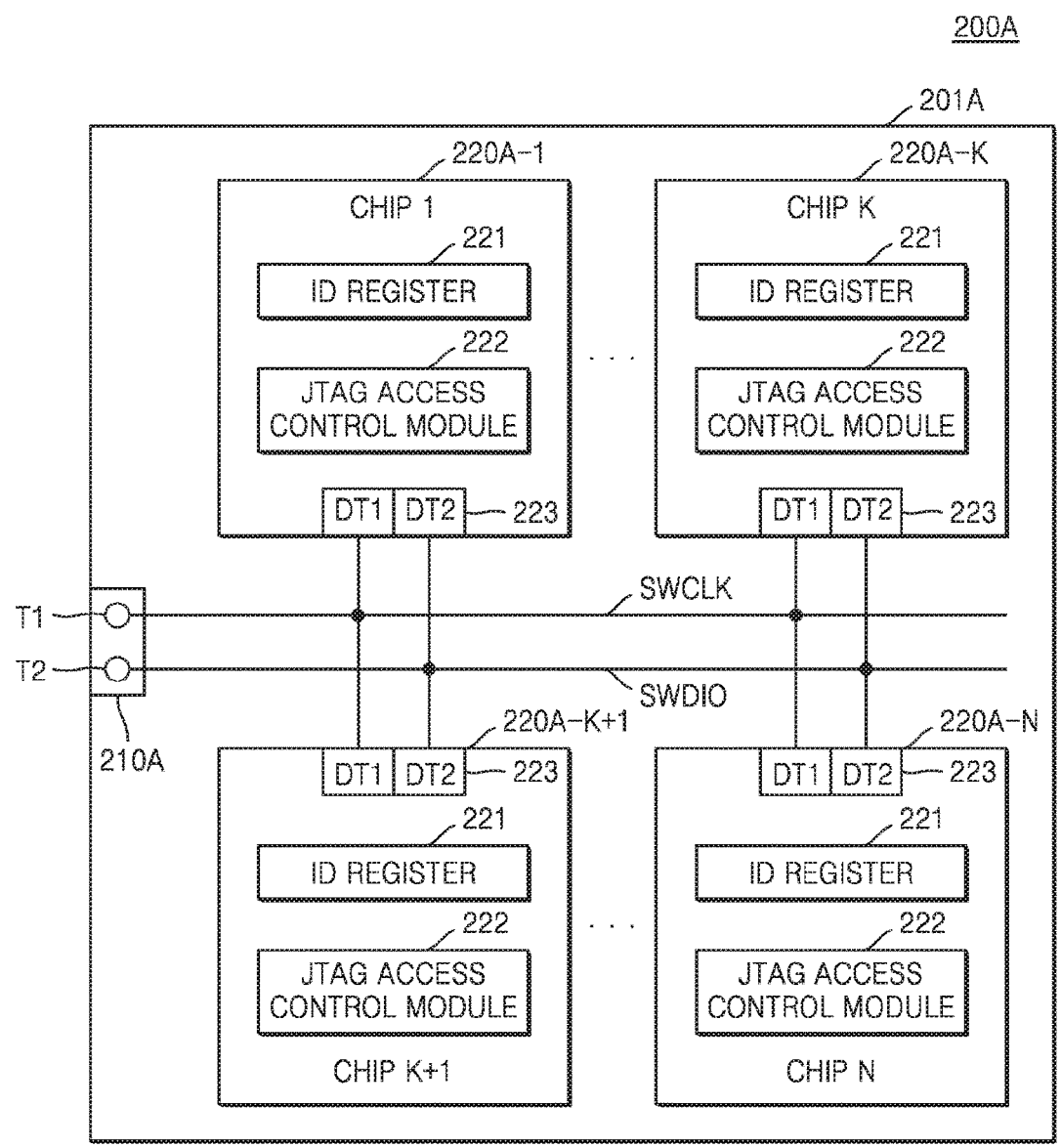
FIG. 3 illustrates a detailed configuration of a multichip system according to an example embodiment.

FIG. 3 illustrates a multichip system 200A as an example of a detailed configuration of the multichip system 200 shown in FIG. 1.

As shown in FIG. 3, the multichip system 200A includes a TAP 210A and a plurality of chips 220A-1 through 220A-N. The TAP 210A and the plurality of chips 220A-1 through 220A-N may be arranged on a PCB 201A.

The TAP 210A includes a clock terminal T1 and a data I/O terminal T2 which are based on a serial wired JTAP protocol. The clock terminal T1 is connected respectively to each of the plurality of chips 220A-1 through 220A-N via a clock signal line SWCLK. Additionally, the data I/O terminal T2 is respectively connected to each of the plurality of chips 220A-1 through 220A-N via a data I/O line SWDIO.

Each of the plurality of chips 220A-1 through 220A-N includes an ID register 221, a JTAG access control module 222, and a debugging port 223. The debugging port 223 includes a first terminal DT1 and a second terminal DT2. The first terminal DT1 of each of the plurality of chips 220A-1 through 220A-N receives a clock signal from the test device 100, and the second terminal DT2 of each of the plurality of chips 220A-1 through 220A-N receives an input of data from the test apparatus 100 or outputs data to the test apparatus 100.

Accordingly, the test apparatus 100 is connected to the first terminal DT1 and the second terminal DT2 of the debugging port 223 of each of the plurality of chips 220A-1 through 220A-N via the TAP 210A consisting of the clock terminal T1 and the data I/O terminal T2. In other words, a clock signal supplied to the clock terminal T1 of the TAP 210A is supplied to the first terminal DT1 of the debugging port 223 of each of the plurality of chips 220A-1 via the clock signal line SWCLK. Additionally, the data I/O terminal T2 of the TAP 210A is connected to the second terminal DT2 of the debugging port 223 of each of the plurality of chips 220A-1 through 220A-N via a data I/O line SWDIO.

In the configuration shown in FIG. 3, a debugging processing may be performed with respect to the plurality of chips 220A-1 through 220A-N by using the serial wired-type TAP 210A.

Figure 4:
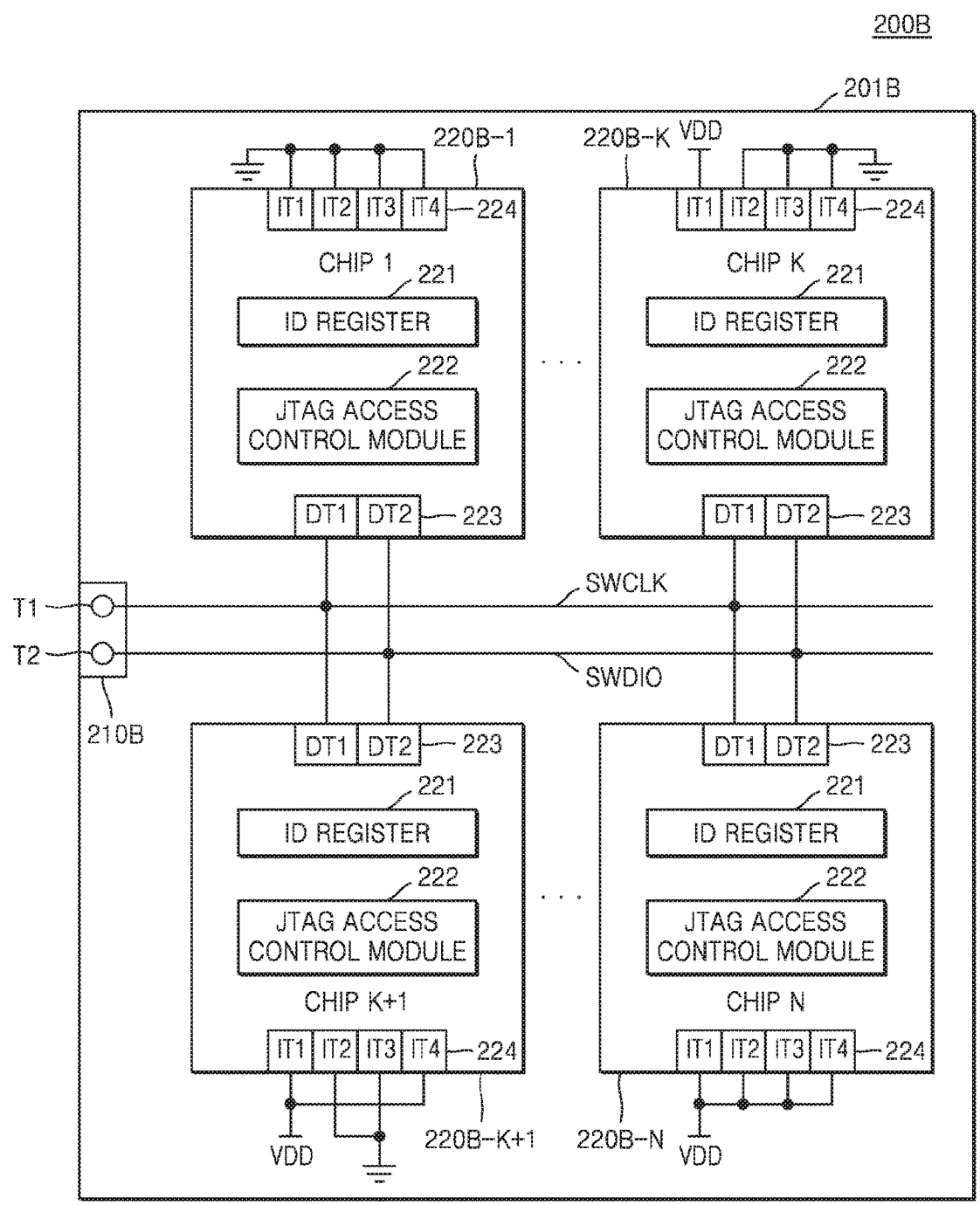
FIG. 4 illustrates a multichip system in which ID information is provided to each chip included in a multichip debugging system according to an example embodiment.

FIG. 4 is a diagram illustrating a configuration of a multichip system 200B in which ID information is provided to each chip included in the multichip debugging system 1000 shown in FIG. 1.

As shown in FIG. 4, the multichip system 200B includes a TAP 210B and a plurality of chips 220B-1 through 220B-N. The TAP 210B and the plurality of chips 220B-1 through 220B-N are arranged on a PCB 201B.

The TAP 210B includes the clock terminal T1 and the data I/O terminal T2 which are based on a serial wired JTAG protocol. The clock terminal T1 is connected to each of the plurality of chips 220B-1 through 220B-N via a clock signal line SWCLK. The data I/O terminal T2 is connected to each of the plurality of chips 220B-1 through 220B-N via a data I/O line SWDIO.

Each of the plurality of chips 220B-1 through 220B-N respectively include the ID register 221, a JTAG access control module 222, the debugging port 223, and an ID information port 224. The debugging port 223 includes the first terminal DT1 and the second terminal DT2. The first terminal DT1 of each of the plurality of chips 220B-1 through 220B-N receives a clock signal from the test apparatus 100, and the second terminal DT2 receives an input of data from the test apparatus 100 or outputs data to the test apparatus 100.

Additionally, a plurality of terminals are included in the ID information port 224 include in each chip. FIG. 4 shows an example in which 4 terminals IT1 through IT4 are included in the ID information port 224 so as to provide ID information in four bits. A number of terminals included in the ID information port 224 may vary depending on a number of bits for expressing ID information.

As an example, in providing a unique ID information to the ID information ports of the plurality of chips 220B-1 through 220B-N, the circuit in the PCB 201B is configured to pull up or pull down corresponding to terminals included in the ID information ports. As an example, unique ID information may be provided to each chip by connecting a power terminal VDD or a ground terminal of the PCB 201B to a plurality of terminals IT1 through IT4 of the ID information port 224 by using different methods for each of the chips.

As an example, all of the plurality of terminals IT1 through IT4 constituting the ID information port 224 may be connected to a ground terminal of the PCB 201B so as to provide ID information [0000] to the chip 200B-1. As another example, the terminal IT1 constituting the ID port 224 of the chip 220B-1 may be connected to the power terminal VDD of the PCB 201B and the other terminals IT2 through IT4 may be connected to a ground terminal of the PCB 201B so as to provide ID information [1000] to the chip 200B-K.

As such, unique ID information may be provided to each of the plurality of chips 220B-1 through 220B-N. Additionally, logical values of the plurality of terminals IT1 through IT4 constituting the ID information port 224 respectively included in each of the plurality of chips 220B-1 through 220B-N are detected, and ID information corresponding to the detected logical values may be stored in the ID register 221.

Figure 5:
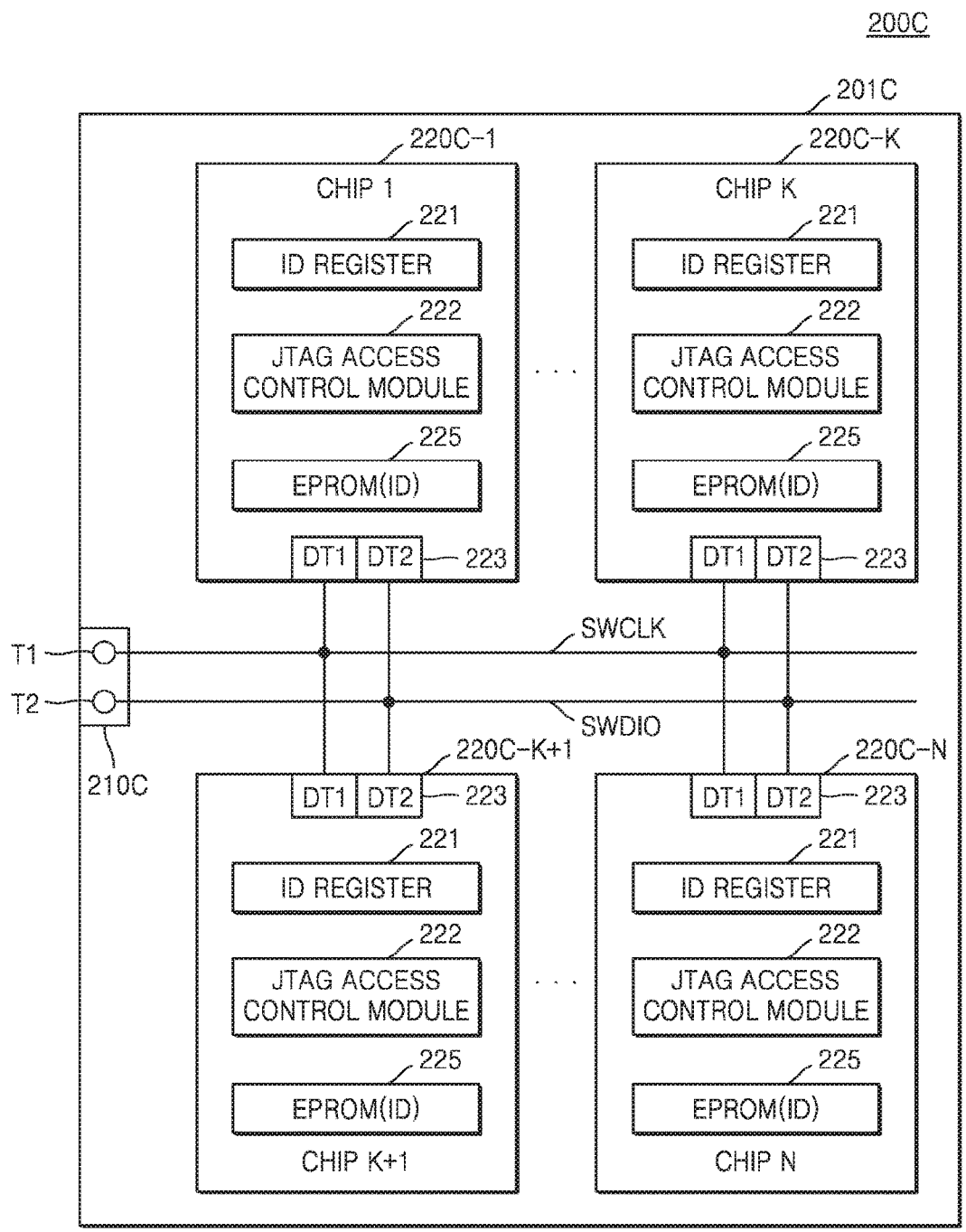
FIG. 5 illustrates a multichip system in which ID information is provided to each chip in a multichip debugging system according to an example embodiment.

FIG. 5 illustrates a multichip system 220C as another example of a multichip system for showing a configuration in which ID information is provided to each chip in the multichip debugging system 1000 shown in FIG. 1.

As shown in FIG. 5, the multichip system 200C includes a TAP 210C and a plurality of chips 220C-1 through 220C-N. The TAP 210C and the plurality of chips 220C-1 through 220C-N may be arranged on a PCB 201C.

The TAP 210C includes the clock terminal T1 and the data I/O terminal T2 which are based on a serial wired JTAP protocol. The clock terminal T1 is connected respectively to each of the plurality of chips 220C-1 through 220C-N via a clock signal line SWCLK. Additionally, the data I/O terminal T2 is respectively connected to each of the plurality of chips 220C-1 through 220C-N via a data I/O line SWDIO.

Each of the plurality of chips 220C-1 through 220C-N includes the ID register 221, the JTAG access control module 222, the debugging port 223, and EPROM 225. The debugging port 223 includes the first terminal DT1 and the second terminal DT2. The first terminal DT1 of each of the plurality of chips 220C-1 through 220C-N receives a clock signal from the test device 100, and the second terminal DT2 receives an input of data from the test apparatus 100 or outputs data to the test apparatus 100.

As an example, ID information may be programmed in the EPROM 225 included in each chip in a manufacturing process. Accordingly, unique ID information may be provided to each of the plurality of chips 220C-1 through 220C-N, by using the EPROM 225. Additionally, ID information may be read from the EPROM 225 included in each of the plurality of chips 220C-1 through 220C-N, and the read ID information may be stored in the ID register 221.

Figure 6:
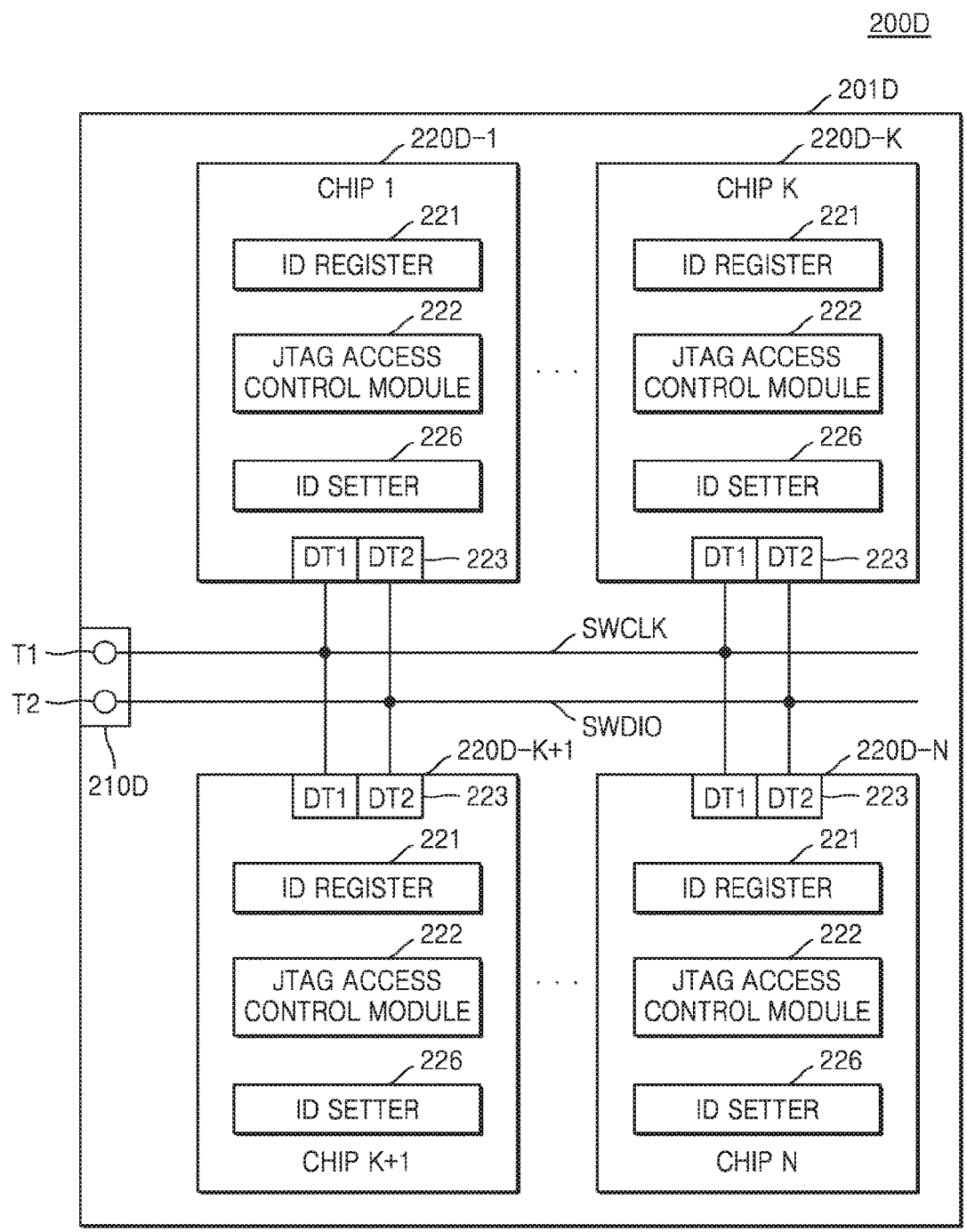
FIG. 6 illustrates a multichip system in which ID information is provided to each chip in a multichip debugging system according to an example embodiment.

FIG. 6 illustrates a multichip system 220D as another example of a multichip system for showing a configuration in which ID information is provided to each chip in the multichip debugging system 1000 shown in FIG. 1.

As shown in FIG. 6, the multichip system 200D includes a TAP 210D and a plurality of chips 220D-1 through 220D-N. The TAP 210D and the plurality of chips 220D-1 through 220D-N may be arranged on a PCB 201D.

The TAP 210D includes the clock terminal T1 and the data I/O terminal T2 which are based on a serial wired JTAP protocol. The clock terminal T1 is connected respectively to each of the plurality of chips 220D-1 through 220D-N via a clock signal line SWCLK. Additionally, the data I/O terminal T2 is respectively connected to each of the plurality of chips 220D-1 through 220D-N via a data I/O line SWDIO.

Each of the plurality of chips 220D-1 through 220D-N includes the ID register 221, the JTAG access control module 222, the debugging port 223, and an ID setter 226. The debugging port 223 includes the first terminal DT1 and the second terminal DT2. The first terminal DT1 of each of the plurality of chips 220D-1 through 220D-N receives a clock signal from the test device 100, and the second terminal DT2 receives an input of data from the test apparatus 100 or outputs data to the test apparatus 100.

The ID setter 226 sets ID information for each of the plurality of chips 220D-1 through 220D-N. As an example, the ID setter 226 may provide unique ID information to each of the plurality of chips 220D-1 through 220D-N by using an e-Fuse.

ID information provided by the ID setter 226 of each of the plurality of chips 220D-1 through 220D-N may be detected, and ID information corresponding to detected logical values may be stored in the ID register 221.

Figure 7:
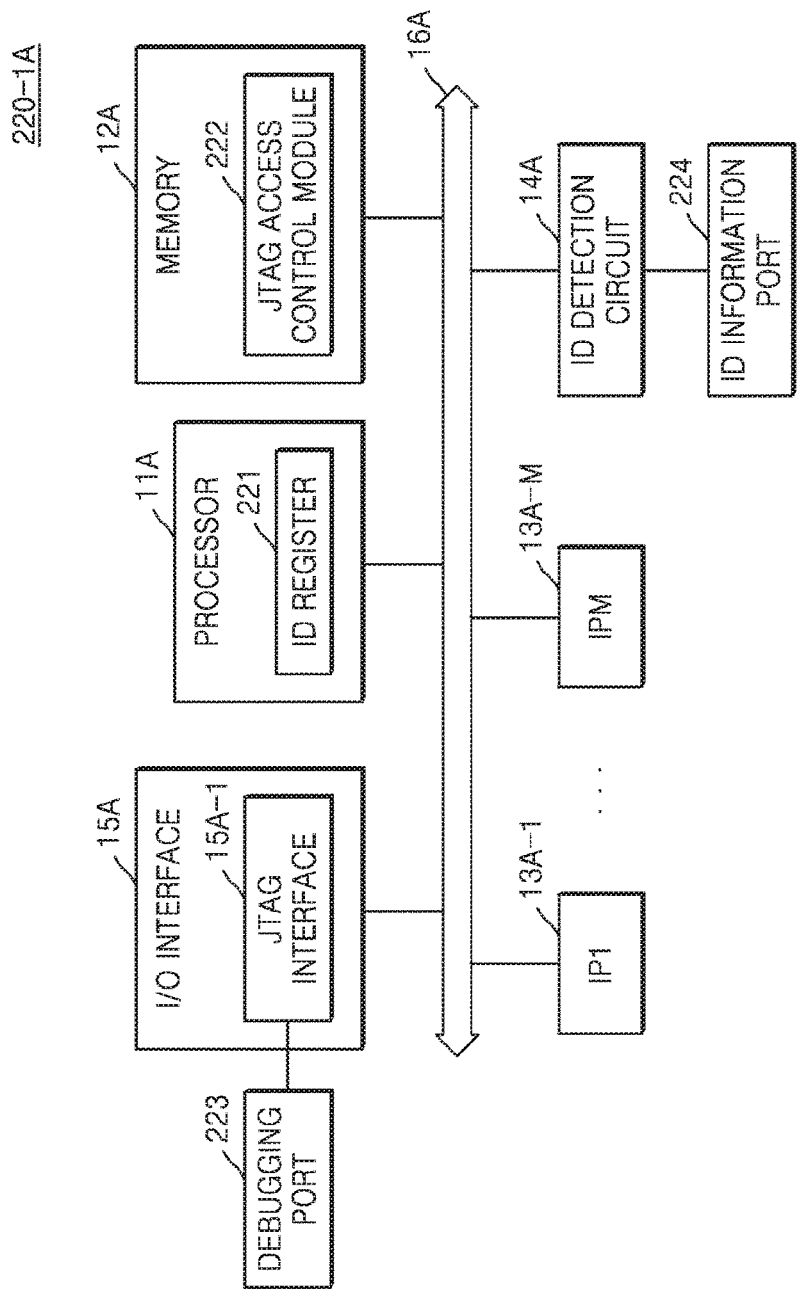
FIG. 7 illustrates a detailed configuration of a chip included in a multichip system according to an example embodiment.

FIG. 7 illustrates a chip 220-1A as an example of a detailed configuration of a chip included in the multichip system shown in FIG. 1.

As shown in FIG. 7, the chip 220-1A includes a processor 11A, a memory 12A, a plurality of function blocks 13A-1 through 13A-M, an ID detection circuit 14A, an I/O interface 15A, a bus 16A, the debugging port 223, and the ID information port 224.

The processor 11A, the memory 12A, the plurality of function blocks 13A-1 through 13A-M, the ID detection circuit 14A, and the I/O interface 15A are connected to the bus 16A, and may transceive data or a signal with each other via the bus 16A.

The processor 11A may include a circuit or a program code for controlling operations of elements of the chip 220-1A. As an example, the processor 11A may include a CPU, an ARM, or an ASIC. The processor 11A may include the ID register 221.

The memory 12A stores a program code and data needed to control elements of the chip 220-1A. As an example, the memory 12A may include read only memory (ROM) or random access memory (RAM). As an example, the memory 12A may store the JTAG access control module 222. The JTAG access control module 222 is software for allowing or forbidding access to the function blocks 13A-1 through 13A-M in the chip 220-1A, based on ID information received from the test apparatus 100. Additionally, the JTAG access control module 222 may include software needed to debug the function blocks 13A-1 through 13A-M according to the JTAG protocol.

The plurality of function blocks 13A-1 through 13A-M are unit devices for performing various functions provided by the chip 220-1A. As an example, the plurality of function blocks 13A-1 through 13A-M may include an image data processing block, an audio data processing block, an encryption/decryption processing block, various operation processing blocks, or the like.

The ID detection circuit 14A detects logical values of a plurality of terminals constituting the ID information port 224. As an example, logical values of the plurality of terminals included in the ID information port 224 may be set by pulling up or pulling down signals by using a circuit in the PCB 201B as shown in FIG. 4. The processor 11A stores logical values, detected by the ID detection circuit 14A, in the ID register 221.

The I/O interface 15A includes hardware and software for transceiving a signal or data with external apparatuses. As an example, the I/O interface 15A may include a JTAG interface 15A-1. The JTAG interface 15A-1 may transceive a signal or data with the test apparatus 100 via the debugging port 223 based on a JTAG protocol.

The processor 11A may perform a debugging operation according to test data by executing the JTAG access control module 222 stored in the memory 12A. If target ID information received from the test apparatus 100 via the JTAG interface 15A-1 is identical to ID information stored in the ID register 221, the processor 11A may activate the function blocks 13A-1 through 13A-M of the chip 220-1A. As an example, if the target ID information is not identical to ID information stored in the ID register 221, the processor 11A may not activate the function blocks 13A-1 through 13A-M of the chip 220-1A. As an example, the function blocks 13A-1 through 13A-M may be activated by allowing power to be supplied to the function blocks 13A-1 through 13A-M. Additionally, the function blocks 13A-1 through 13A-M may be deactivated by obstructing power from being supplied to the function blocks 13A-1 through 13A-M.

Then, the processor 11A may select a function block to be tested, from among the function blocks 13A-1 through 13A-M, based on test data received from the test apparatus 100 via the JTAG interface 15A-1, and may perform control for processing test data in the selected function block. As an example, the test data may include data regarding selection of one from among the function blocks 13A-1 through 13A-M and test operation conditions.

The processor 11A transmits data, output from the function block that processed the test data, to the test apparatus 100 via the JTAG interface 15A-1. Then, if the data received from the chip 220-1A matches expected data, the test is determined as being successful. If the data received from the chip 220-1A does not match expected data, the test apparatus performs a debugging process of finding and fixing a defect in hardware or software of the chip 220-1A.

As a reference, if target ID information is not identical to ID information stored in the ID register 221, the test data is also transmitted to the chip 220-1A. However, if the target ID information is not identical to ID information stored in the ID register 221, because function blocks in the chip 220-1A are not activated, the test data may not be processed.

Figure 8:
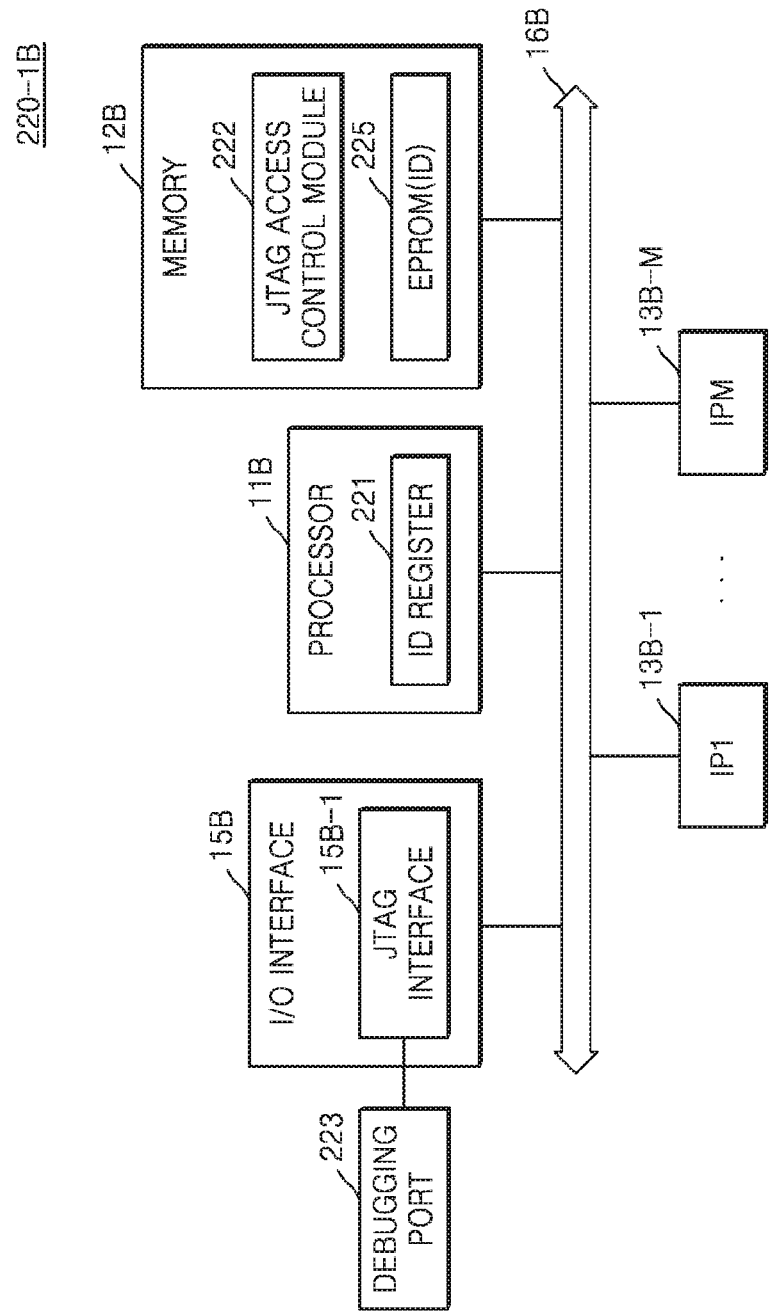
FIG. 8 illustrates a detailed configuration of a chip included in a multichip system according to an example embodiment.

FIG. 8 illustrates a chip 220-1B as another example of a detailed configuration of a chip included in the multichip system 200 shown in FIG. 1.

As shown in FIG. 8, the chip 220-1B includes a processor 11B, a memory 12B, a plurality of function blocks 13B-1 through 13B-M, an I/O interface 15B, a bus 16B, and the debugging port 223.

The processor 11B, the memory 12B, the plurality of function blocks 13B-1 through 13B-M, and the I/O interface 15B are connected to the bus 16B, and may transceive data or a signal with each other via the bus 16B.

The processor 11B may include a circuit or a program code for controlling operations of elements of the chip 220-1B. As an example, the processor 11B may include a CPU, an ARM, or an ASIC. The processor 11B may include the ID register 221.

The memory 12B stores program codes and data needed to control elements of the chip 220-1B. As an example, the memory 12B may include ROM or RAM. As an example, the memory 12B may store the JTAG access control module 222. The JTAG access control module 222 is software for debugging elements of the chip 220-1B based on ID information and data received from the test apparatus 100.

Additionally, the memory 12B includes the EPROM 225. As an example, ID information may be programmed in the EPROM 225 in a manufacturing process. Accordingly, unique ID information may be allocated respectively to each of the plurality of chips 220A-1 through 220A-N included in the multichip system 200 shown in FIG. 1.

The plurality of function blocks 13B-1 through 13B-M are unit devices for performing various functions provided by the chip 220-1B. As an example, the plurality of function blocks 13B-1 through 13B-M may include an image data processing block, an audio data processing block, an encryption/decryption processing block, various operation processing blocks, or the like.

The I/O interface 15B includes hardware and software for transceiving a signal or data with external apparatuses. As an example, the I/O interface 15B may include a JTAG interface 15B-1. The JTAG interface 15B-1 may transceive a signal or data with the test apparatus 100 via the debugging port 223 based on a JTAG protocol.

When the chip 220-1B is initialized, the processor 11B reads ID information from the EPROM 225, and stores the read ID information in the ID register 221. Then, the processor 11B may perform a debugging operation according to a test, by executing the JTAG access control module 222 stored in the memory 12B. As an example, if target ID information received from the test apparatus 100 via the JTAG interface 15B-1 is identical to ID information stored in the ID register 221, the processor 11B may activate the function blocks 13B-1 through 13B-M of the chip 220-1B. As an example, if the target ID information is not identical to ID information stored in the ID register 221, the processor 11B may not activate the function blocks 13B-1 through 13B-M of the chip 220-1B.

Then, the processor 11B may select a function block to be tested, from among the function blocks 13B-1 through 13B-M, based on test data received from the test apparatus 100 via the JTAG interface 15B-1, and may perform control for processing the test data in the selected function block.

The processor 11B transmits data, output from the function block that processed the test data, to the test apparatus 100 via the JTAG interface 15B-1. Then, if data received from the chip 220-1B matches expected data, the test apparatus 100 determines that the test is successful. If data received from the chip 220-1A does not match expected data, the test apparatus 100 performs a debugging process of finding and fixing a defect in hardware or software of the chip 220-1B.

Figure 9:
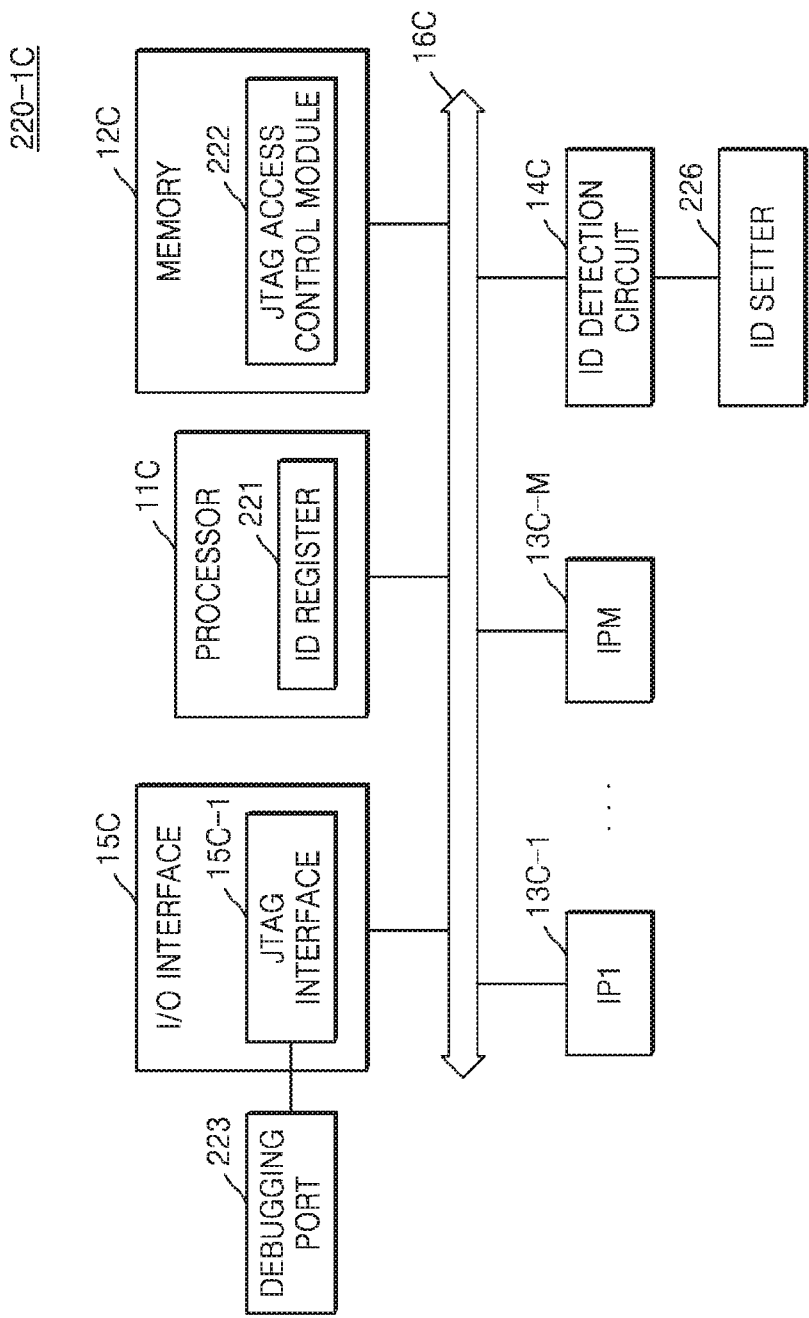
FIG. 9 illustrates a detailed configuration of a chip included in a multichip system according to an example embodiment.

FIG. 9 illustrates a chip 220-1C as an example of a detailed configuration of a chip included in the multichip system 200 shown in FIG. 1.

As shown in FIG. 9, the chip 220-1C includes a processor 11C, a memory 12C, a plurality of function blocks 13C-1 through 13C-M, an ID detection circuit 14C, an I/O interface 15C, a bus 16C, the debugging port 223, and the ID setter 226.

The processor 11C, the memory 12C, the plurality of function blocks 13C-1 through 13C-M, the ID detection circuit 14C, the I/O interface 15C, and the bus 16C operate substantially identically to the processor 11A, the memory 12A, the plurality of function blocks 13A-1 through 13A-M, the ID detection circuit 14A, the I/O interface 15A, and the bus 16A which are shown in FIG. 7. Thus, a description thereof will not be provided here again.

According to an example embodiment described with reference to FIG. 7, ID information is allocated to the ID information port 224 arranged in the chip 220-1B, by using a circuit in the PCB 201B shown in FIG. 4. However, according to an example embodiment described with reference to FIG. 9, ID information is allocated by using the ID setter 226 included in the chip 220-1C, instead of arranging the ID information port in the chip 220-1C. As an example, the ID setter 226 may provide unique ID information respectively to each of the plurality of chips 220-1 through 220-N included in the multichip system 200, by using an e-Fuse. As an example, a logical value of a circuit which indicates ID information may be set variously by using an e-Fuse.

The processor 11C stores the logical values, detected from the ID setter 226 by the ID detection circuit 14C, in the ID register 221. Then, the processor 11C may perform a debugging process as described above, by executing the JTAG access control module 222 stored in the memory 12C.

Figure 10:
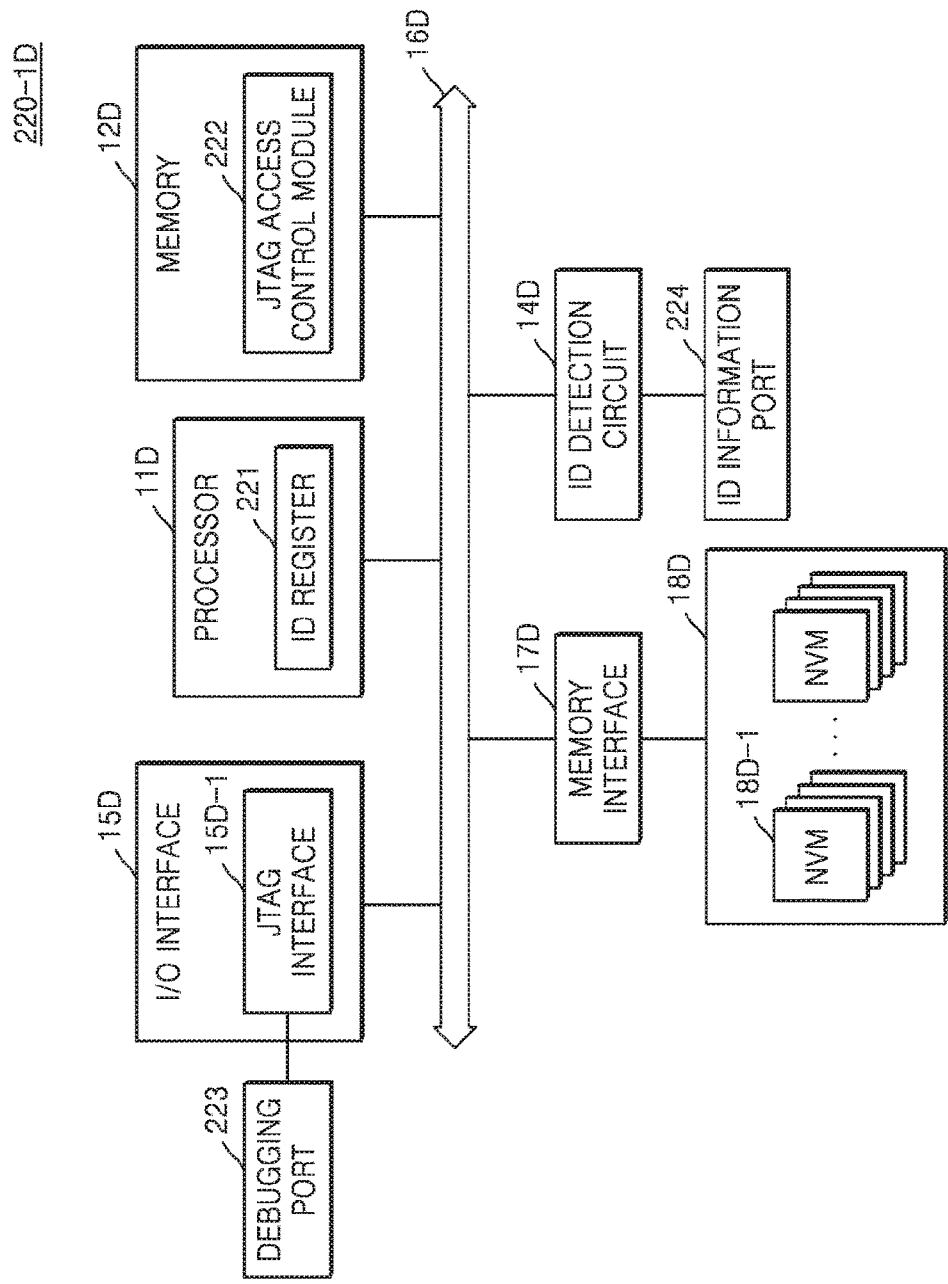
FIG. 10 illustrates a detailed configuration of a chip and a storage system according to an example embodiment.

FIG. 10 illustrates a chip 220-1D as an example of a detailed configuration of a chip when a storage system is implemented by using the multichip system shown 200 shown in FIG. 1.

As shown in FIG. 10, the chip 220-1D includes a processor 11D, a memory 12D, an ID detection circuit 14D, an I/O interface 15D, a bus 16D, the debugging port 223, the ID information port 224, a memory interface 17D, and a memory device 18D.

The processor 11D, the memory 12D, the ID detection circuit 14D, the I/O interface 15D, and the memory interface 17D are connected to the bus 16D, and may transceive data or a signal with each other via the bus 16D.

The processor 11D may include a circuit or a program code for controlling operations of elements of the chip 220-1D. As an example, the processor 11D may include a CPU, an ARM, or an ASIC. The processor 11D may include the ID register 221.

The memory 12D may store program codes and data needed to control elements of the chip 220-1D. As an example, the memory 12D may include ROM or RAM. As an example, the memory 12D may store the JTAG access control module 222.

The ID detection circuit 14D detects logical values of a plurality of terminals constituting the ID information port 224. As an example, logical values of the plurality of terminals constituting the ID information port 224 may be set, by pulling up or pulling down signals by using a circuit in the PCB 201B as shown in FIG. 4. The processor 11D stores the logical values, detected by the ID detection circuit 14D, in the ID register 221.

The I/O interface 15D includes hardware and software for transceiving a signal or data with external apparatuses. As an example, the I/O interface 15D may include a JTAG interface 15D-1. The JTAG interface 15D-1 may transceive a signal or data with the test apparatus 100 via the debugging port 223 based on a JTAG protocol.

As an example, the I/O interface 15D includes a protocol for data exchange with a host connected to the chip 220-1D, and performs an interface with the host. As an example, the I/O interface 15D may be implemented as an advanced technology attachment (ATA) interface, a serial advanced technology attachment (SATA) interface, a parallel advanced technology attachment (PATA) interface, a universal serial bus (USB), a serial attached small computer system (USB) interface, a small computer system interface (SCSI), an embedded multimedia card (eMMC) interface, a universal flash storage (UFS) interface, a peripheral component interconnect (PCI) interface, a peripheral component interconnect express (PCIe) interface, a network interface, or the like. However, these are only examples, and the I/O interface 15D is not limited thereto. The I/O interface 15D may receive a command or data from a host or transmit data to a host according to control by the processor 11D.

The memory interface 17D is electrically connected to the memory device 18D. The memory interface 17D may transmit a command, an address, or data to the memory device 18D or receive data from the memory device 18D, according to control by the processor 11D. The memory interface 17D may be configured to support a not and (NAND) flash memory or a not or (NOR) flash memory. The memory interface 17D may be also configured to perform software or hardware interleave operations via a plurality of channels.

The memory device 18D may include one or more non-volatile memories (NVM) 18D-1. As an example, the NVM 18D-1 applied to the memory device 18D may include phase change RAM (PRAM), ferroelectric RAM (FRAM), or the like, as well as a flash memory. As another example, the memory device 18D may be configured to have a form in which at least one NVM and at least one volatile memory are combined, or a form in which at least two types of NVMs are combined.

When the chip 220-1D is initialized, the processor 11D may read a program code or data needed to control operations performed by the chip 220-1D, stored in the memory device 18D, and load the program code or the data onto the memory 12D. As an example, when the chip 220-1D is initialized, software of the JTAG access control module 222 stored in the memory device 18D may be loaded onto the memory 12D.

The processor 11D may perform a debugging process according to ID information, by executing the JTAG access control module 222 stored in the memory 12D. As an example, if target ID information received from the test apparatus 100 via the JTAG interface 15D-1 is identical to ID information stored in the ID register 221, the processor 11D may activate the memory interface 17D and the memory device 18D included in the chip 220-1D. As an example, if the target ID information is not identical to ID information stored in the ID register 221, the processor 11D may not activate the memory interface 17D and the memory device 18D included in the chip 220-1D.

Then, the processor 11D may select an NVM included in the memory device 18D, based on test data received from the test apparatus 100 via the JTAG interface 15D-1, and perform a test operation. As an example, the test data may include information about elements to be tested or information about test conditions. As an example, the processor 11D may perform a write operation and a read operation in at least one NVM included in the memory device 18D, and transmit data regarding a result of the performing to the test apparatus 100.

Then, if data received from the chip 220-1D matches expected data, the test apparatus 100 determines that the test is successful. If data received from the chip 220-1D does not match expected data, the test apparatus 100 performs a debugging process of finding and fixing a defect in hardware or software of the chip 220-1D.

With respect to the storage system shown in FIG. 10, an example of determining ID information about the chip 220-1D based on a logical value of the ID information port 224, by using a circuit in the PCB 201B as shown in FIG. 4. As another example, as described above with reference to FIGS. 5 and 6, ID information about the chip 220-1D may be determined by using a programmable fuse or an EPROM.

Figure 11:
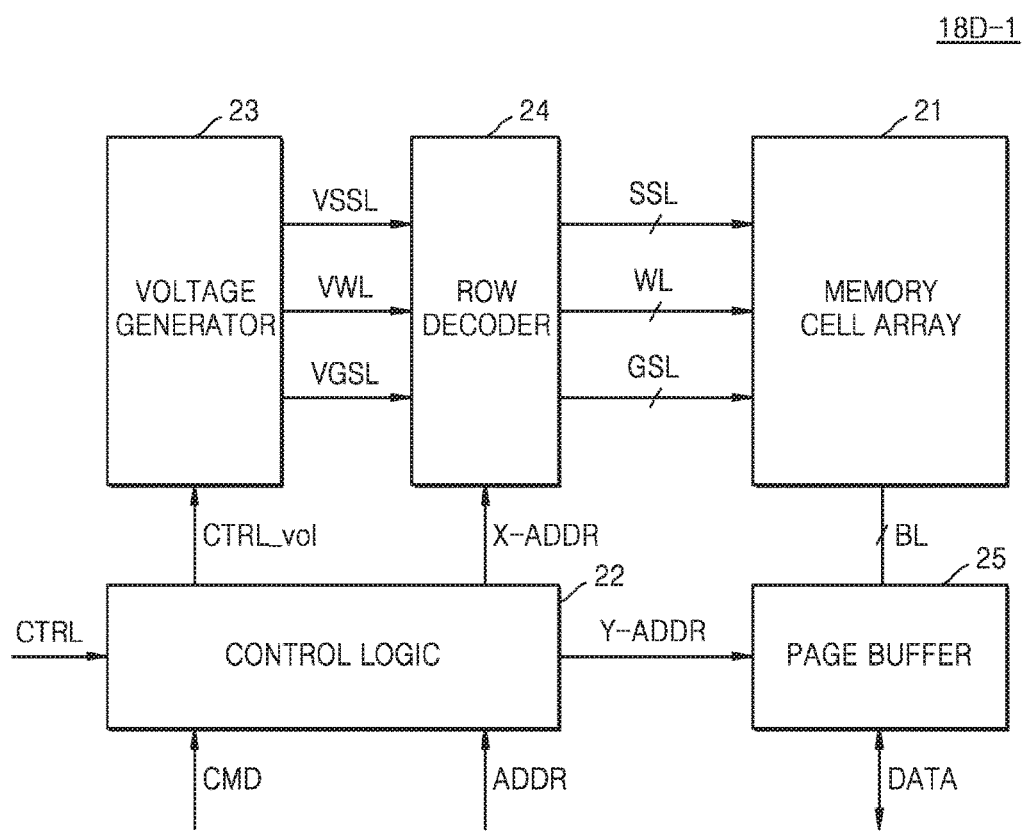
FIG. 11 illustrates a detailed configuration of a non-volatile memory according to an example embodiment.

FIG. 11 illustrates an example of a detailed configuration of the NVM 18D-1 shown in FIG. 10.

Referring to FIG. 11, the NVM 18D-1 may include a memory cell array 21, a control logic 22, a voltage generator 23, a row decoder 24, and a page buffer 25. Hereinafter, elements included in the NVM 18D-1 are described in detail.

The memory cell array 21 may be connected to one or more string selection lines SSL, a plurality of word lines WL, and one or more ground selection lines GSL. The memory cell array 21 may also be connected to a plurality of bit lines BL. The memory cell array 21 may include a plurality of memory cells arranged in areas in which the plurality of word lines WL and the plurality of bit lines BL cross each other.

If an erase voltage is applied to the memory cell array 21, the plurality of memory cells are in an erase state. If a program voltage is applied to the memory cell array 21, the plurality of memory cells are in a program state. Then, each memory cell may have a state from among an erase state or 1st through nth program states P1 through Pn, according to a threshold voltage.

Here, n may be a natural number equal to or greater than 2. For example, if the memory cell is a 2-bit level cell, n may be 3. As another example, if the memory cell is a 3-bit level cell, n may be 7. As another example, if the memory cell is a 3-bit level cell, n may be 7. As another example, if the memory cell is a 4-bit level cell, n may be 15. As such, the plurality of memory cells may include multi-level cells. However, example embodiments are not limited thereto, and the plurality of memory cells may include single-level cells.

The control logic 22 may output various control signals for writing data to the memory cell array 21 or reading data from the memory cell array 21, based on a command CMD, an address ADDR, or a control signal CTRL received from the processor 11D. Thus, the control logic 22 may control all operations performed in the NVM 18D-1.

Various control signals, output from the control logic 22, may be provided to the voltage generator 23, the row decoder 24, and the page buffer 25. In detail, the control logic 22 may provide a power control signal CTRL_vol to the voltage generator 23, and provide a row address X_ADDR to the row decoder 24, or provide a column address Y_ADDR to the page buffer 25.

The voltage generator 23 may generate various types of voltage for performing a program, read, or erase operation on the memory cell array 21, based on the voltage control signal CTRL_vol. In detail, the voltage generator 23 may generate a first driving voltage VWL for driving the plurality of word lines WL, a second driving voltage VSSL for driving a plurality of string selection lines SSL, and a third driving voltage VGSL for driving a plurality of round selection lines GSL.

The first driving voltage VWL may be a program voltage (or a write voltage), a read voltage, an erase voltage, a pass voltage, or a program verification voltage. Additionally, the second driving voltage VSSL may be a string selection voltage, that is, an on voltage or an off voltage. Further, the third driving voltage VGSL may be a ground selection voltage, that is, an on voltage or an off voltage.

The row decoder 24 may be connected to the memory cell array 21 via the plurality of word lines WL, and activate one or more word lines from among the plurality of word lines WL in response to a row address X_ADDR received from the control logic 22. In detail, if a read operation is performed, the row decoder 24 may apply a read voltage to a selected word line, and apply a pass voltage to a non-selected word line.

If a program operation is performed, the row decoder 24 may apply a program voltage to a selected word line, and apply a pass voltage to a non-selected word line.

The page buffer 25 may be connected to the memory cell array 21 via the plurality of bit lines BL. In detail, if a read operation is performed, the page buffer 25 operates as a sense amplifier, and output data DATA stored in the memory cell array 21. If a program operation is performed, the page buffer 25 may operate as a write driver, and thus, input data DATA which is to be stored in the memory cell array 21.

Figure 12:
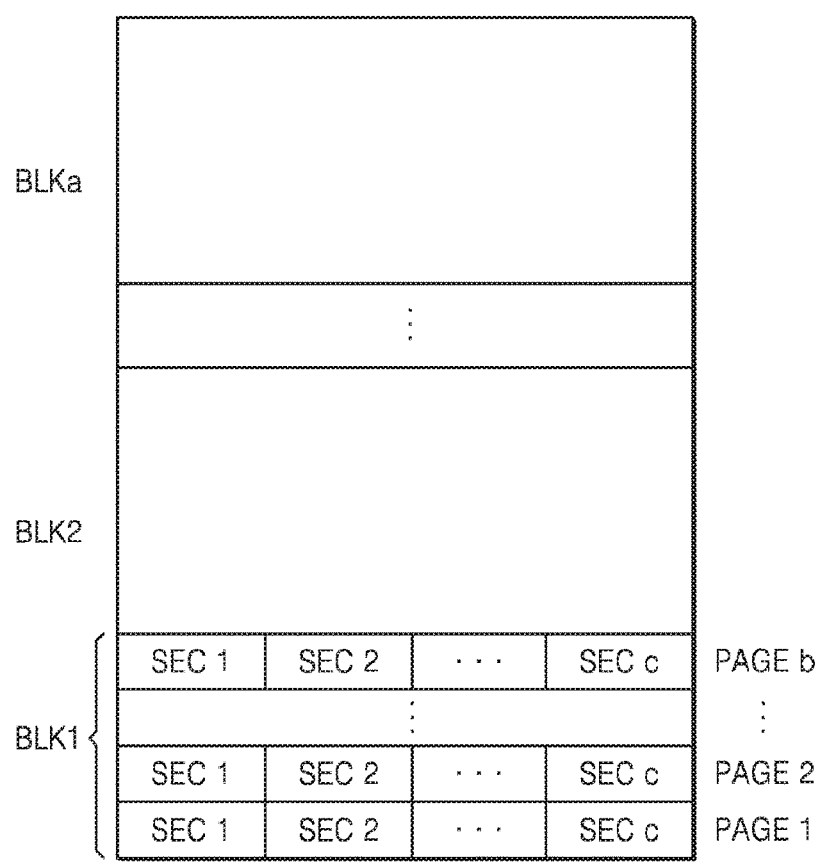
FIG. 12 illustrates a memory cell array according to an example embodiment.

FIG. 12 illustrates an example of the memory cell array 21 shown in FIG. 11.

Referring to FIG. 12, the memory cell array 21 may be a flash memory cell array. The memory cell array 21 may include a memory blocks BLK through BLKa (where a is an integer equal to or greater than 2). Each of the memory blocks BLK1 through BLKa may include b pages PAGE1 through PAGEb (where b is an integer equal to or greater than 2). Each of the pages PAGE1 through PAGEb may include c sectors SEC1 through SECc (where c is an integer equal to or greater than 2). In FIG. 12, for convenience of illustration, only the memory block BLK1 is shown as including the pages PAGE1 through PAGEb and the sectors SEC1 through SECc included in the memory block BLK1 are shown. However, the other memory blocks BLK2 through BLKa may also have a same structure as that of the block BLK1.

Figure 13:
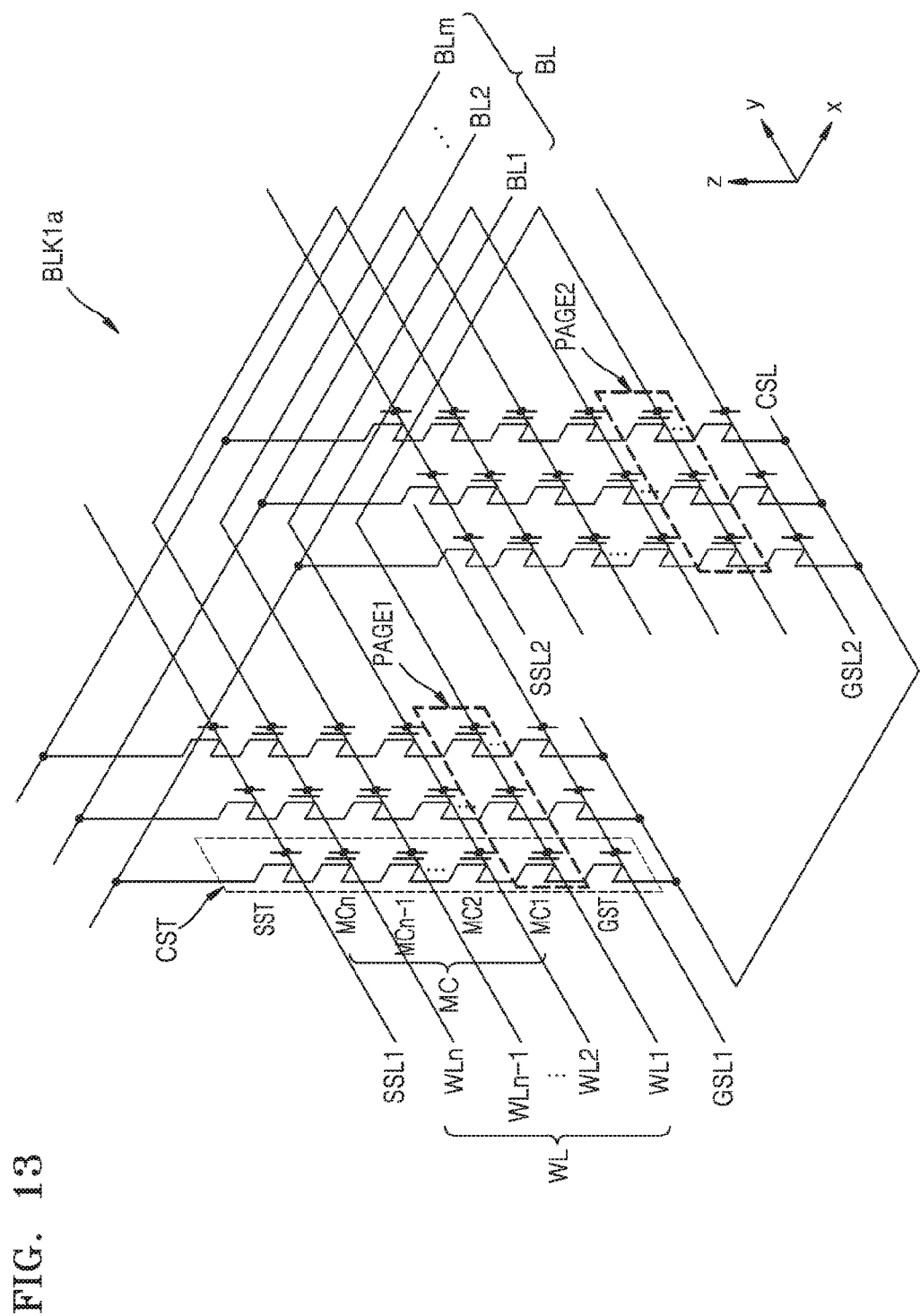
FIG. 13 illustrates a circuit diagram of a first memory block according to an example embodiment.

FIG. 13 illustrates a circuit diagram showing a first memory block BLK1a as an example of a first memory block included in the memory cell array 21 shown in FIG. 12.

Referring to FIG. 13, the first memory block BLK1a may be a NAND flash memory having a vertical structure. Each of the blocks BLK1 through BLKa, shown in FIG. 12, may be implemented as shown in FIG. 13. With reference to FIG. 13, a first direction is referred to as an x direction, a second direction is referred to as a y direction, and a third direction may be referred to as a z direction. However, example embodiments are not limited thereto, and the first through third directions may vary.

The first memory block BLK1a may include a plurality of cell strings CST, the plurality of word lines WL, the plurality of bit lines BL, a plurality of ground selection lines GSL1 and GSL2, a plurality of string selection lines SSL1 and SSL2, and a common source line CSL. A number of the plurality of cell strings CST, a number of the plurality of word lines WL, a number of the plurality of bit lines BL, a number of the plurality of ground selection lines GSL1 and GSL2, and a number of the plurality of string selection lines SSL1 and SSL2 may vary according to example embodiments.

A cell string CST may include a string selection transistor SST, a plurality of memory cells MC, and the ground selection transistor GSTS which are serially connected to each other between a bit line BL corresponding to the cell string CST and the common source line CSL. However, example embodiments are not limited thereto. According to another example embodiment, a cell string CST may further include at least one dummy cell. According to another example embodiment, a cell string CST may include at least two string selection transistors or at least two ground selection transistors.

Additionally, the plurality of cell strings CST may extend in the third direction (the z direction). In detail, the plurality of cell strings CST may extend on a substrate in a vertical direction (the z direction). Accordingly, the memory block BLK1a including the plurality of cell string CST may be referred to as a NAND flash memory in a vertical direction. As such, a degree of integration of the memory cell array 21 may be enhanced by extending the plurality of cell strings CST on a substrate in a vertical direction (the z direction).

The plurality of word lines WL may extend in the first direction (the x direction) or the second direction (the y direction), and each word line WL may be connected to memory cells MC corresponding thereto. Accordingly, a plurality of memory cells MC arranged on the same layer and in the first direction (the x direction) or the second direction (the y direction) may be connected to a same word line WL. In detail, each word line WL may be connected to a gate of a memory cell MC and control the memory cell MC. The plurality of memory cells MC may store data, and be programmed, read, or erased according to a signal transmitted to the memory cells MC via a word line WL connected thereto.

The plurality of bit lines BL may extend in the first direction (the x direction), and be connected to a string selection transistor SST. Accordingly, a plurality of string selection transistors SST arranged to neighbor each other along the first direction (the x direction) may be connected to a same bit line BL. In detail, each bit line BL may be connected to a drain of a string selection transistor SST.

The plurality of string selection lines SSL1 and SSL2 may extend in the second direction (the y direction), and be connected to a string selection transistor SST. Accordingly, a plurality of string selection transistors SST arranged to neighbor each other along the second direction (the y direction) may be connected to a same string selection line SSL1 or SSL2. In detail, each string selection line SSL1 or SSL2 may be connected to a gate of a string selection transistor SST, and control the string selection transistor SST.

The plurality of ground selection lines GSL1 and GSL2 may extend in the second direction (the y direction), and be connected to ground selection transistors GST. Accordingly, a plurality of ground selection transistors GST arranged to neighbor each other along the second direction (the y direction) may be connected to a same string selection line GSL1 or GSL2. In detail, each string selection line GSL1 or GSL2 may be connected to a gate of a ground selection transistor GST, and control the ground selection transistor GST.

Additionally, ground selection transistors GST included in each cell string CST may be commonly connected to the common source line CSL. In detail, the common source line CSL may be connected to a source of the ground selection transistors GST.

A plurality of memory cells MC, commonly connected to a same word line WL and a same string selection line SSL1 or SSL2, and arranged to neighbor with each other along the second direction (the y direction), may be referred to as a page. For example, a plurality of memory cells MC commonly connected to a first word line WL1 and a first string selection line SSL1, and arranged to neighbor with each other along the second direction (the y direction), may be referred to as a first page PAGE1. Additionally, a plurality of memory cells MC commonly connected to the first word line WL1 and the second string selection line SSL2, and arranged to neighbor with each other along the second direction (the y direction), may be referred to as a second page PAGE2.

A voltage of 0 V may be applied to a bit line BL, an on voltage may be applied to a string selection line SSL, and an off voltage may be applied to a ground selection line GLS so as to perform a program operation on a memory cell MC. An on voltage may be equal to or greater than a threshold voltage of a string selection transistor SST so as to turn on the string selection transistor SST, and an off voltage may be equal to or less than a threshold voltage of ground selection transistors GST so as to turn off the ground selection transistors GST. Additionally, a program voltage may be applied to a memory cell selected from among the plurality of memory cells MC, and a pass voltage may be applied to the other memory cells MC. If a program voltage is applied to memory cells MC, an electric charge may be injected into the memory cells MC by using a Fowler-Nordheim (F-N) tunneling effect. A pass voltage may be equal to or greater than a threshold voltage of memory cells MC.

An erase voltage may be applied to a body of the memory cells MC and a voltage of 0 V may be applied to word lines WL so as to perform an erase operation on the memory cells MC. Accordingly, data of the memory cells MC may be erased at a same time.

Figure 14:
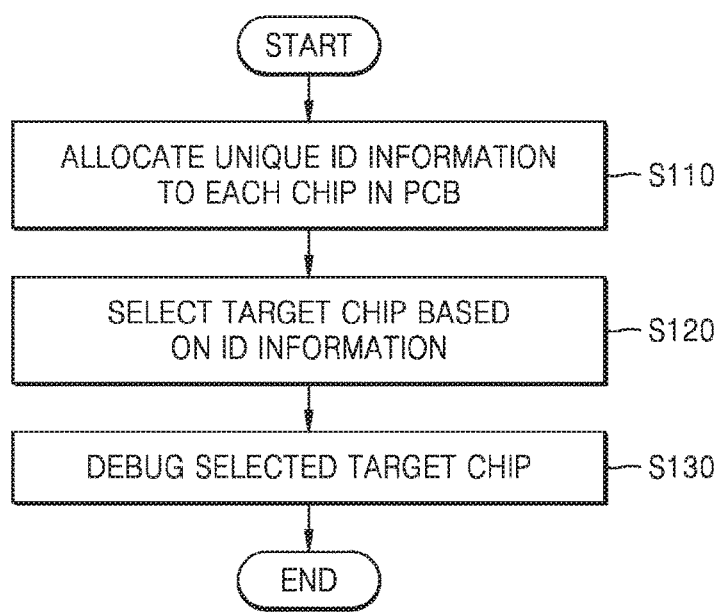
FIG. 14 is a flowchart of a multichip debugging method according to an example embodiment.

FIG. 14 is a flowchart of a multichip debugging method according to an example embodiment.

As an example, a process, by the multichip debugging system 1000 shown in FIG. 1, of performing the multichip debugging method is described.

In operation S110, unique ID information is allocated to each chip in a PCB on which a plurality of chips are arranged. As an example, unique ID information may be provided to each chip, by pulling up or pulling down signals by using a circuit in the PCB. As shown in FIG. 4, unique ID information may be provided to each chip by connecting the power terminal VDD or the ground terminal of the PCB 201B to the plurality of terminals IT1 through IT4 constituting the ID information port 224 included in each chip. the unique ID information may be provided by using different methods depending on the chip. As another example, as shown in FIGS. 5 and 6, ID information may be provided to each chip by using a programmable fuse in the chip or an EPROM.

Then, in operation S120, the multichip debugging system 1000 selects a target chip based on ID information. As an example, a target chip to be tested, from among the plurality of chips 220-1 through 220-N, may be selected based on target ID information received via the TAP 210. As an example, test elements that are included in a target chip that is provided with ID information identical to target ID information received via the TAP 210, from among the plurality of chips 220-1 through 220-N in the multichip system 200, are activated. Additionally, test elements, included in the other chips provided with ID information different from the target ID information, are not activated.

Then, in operation S130, the multichip debugging system 1000 debugs the selected chip in the multichip system 200. As an example, if the test apparatus 100 transmits test data to each chip via the test access port 210, the multichip debugging system 1000 debugs only a target chip selected based on the target ID information, from among the plurality of chips 220-1 through 220-N, by using the test data. As a reference, test elements of chips to which ID information different from the target ID information is allocated are not activated, and thus, may not respond to the test data.

Figure 15:
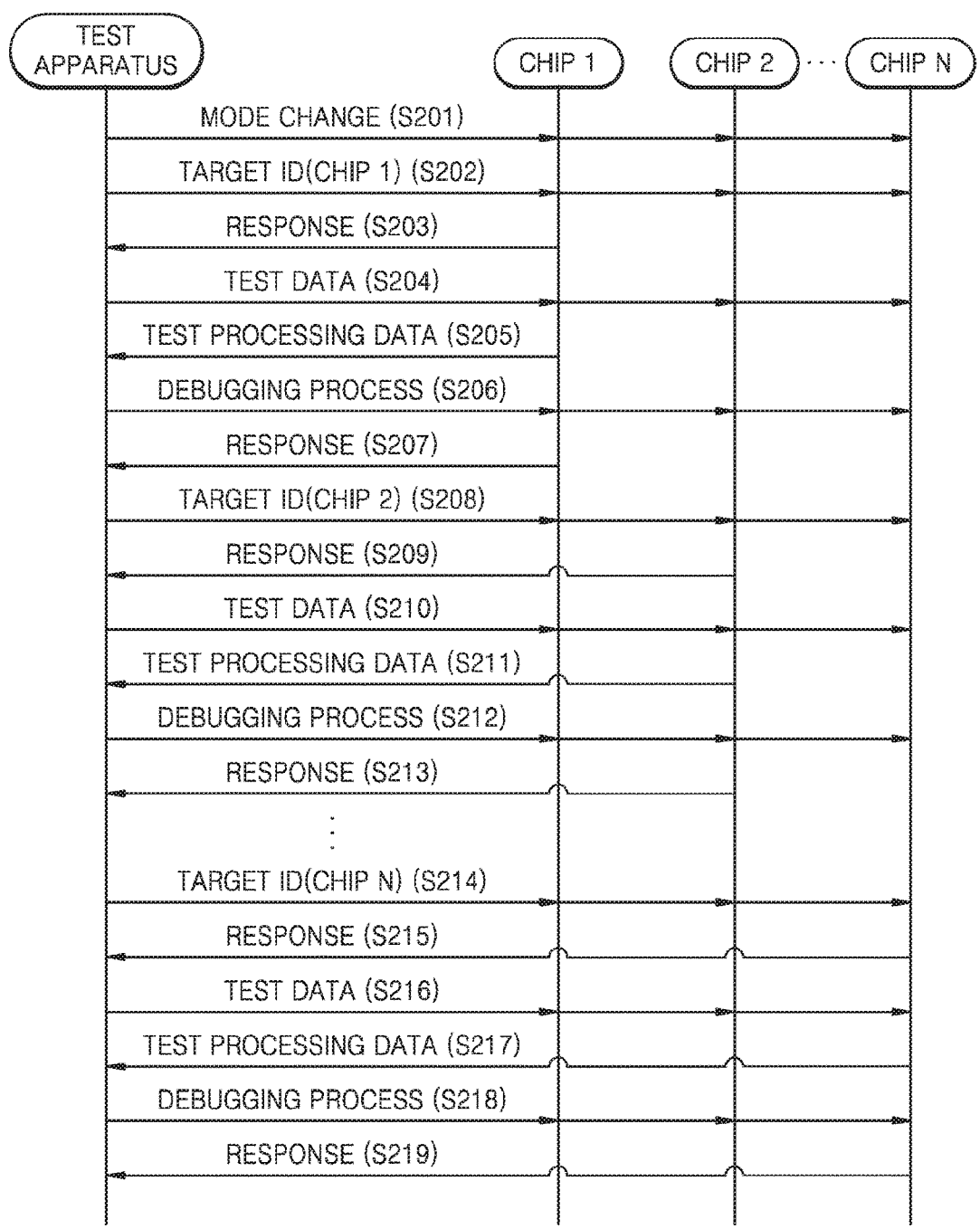
FIG. 15 illustrates a detailed operation of a debugging method performed by the multichip debugging system shown in FIG. 1 according to an example embodiment.

FIG. 15 illustrates an example of a detailed operation of a debugging method performed by the multichip debugging system 1000 shown in FIG. 1.

In operation 5210, the test apparatus 100 transmits information indicating mode conversion to a JTAG test mode to the multichip system 200 via the TAP 210. Because the plurality of chips 220-1 through 220-N included in the multichip system 200 are commonly connected to the TAP 210, all of the plurality of chips 220-1 through 220-N are converted into a JTAG test mode. As an example, if the plurality of chips 220-1 through 220-N are converted into a JTAG test mode, test elements of the plurality of chips 220-1 through 220-N included in the multichip system 200 are deactivated. In other words, power supply to the test elements of the plurality of chips 220-1 through 220-N included in the multichip system 200 is obstructed.

Then, in operation 5202, the test apparatus 100 transmits target ID information for selecting a chip to be tested to the multichip system 200 via the TAP 210. As an example, the test apparatus 100 may transmit ID information about a chip 220-1 (CHIP 1) as target ID information to the multichip system 200.

The chip 220-1 (CHIP 1) to which ID information identical to the target ID information is allocated activates the test elements, and then transmits response information RESPONSE to the test apparatus 100 in operation 5203. The other chips, to which ID information that is not identical to the target ID information is allocated, may not activate test elements, and may not generate response information RESPONSE. In other words, the chip 220-1 (CHIP 1), to which the target ID information allocated, allows power supply to the test elements.

Then, in operation 5204, the test apparatus 100 transmits the test data to the multichip system 200 via the TAP 210. Then, all of the plurality of chips 220-1 through 220-N included in the multichip system 200 receive the test data. However, because only the test elements of the chip 220-1 (CHIP 1), to which the target ID information is allocated, are activated, only the test elements of the chip 220-1 (CHIP 1) process the test data.

In operation 5205, the chip 220-1 (CHIP 1) transmits test processing data, which corresponds to a result of processing the test data, to the test apparatus 100.

In operation 5206, the test apparatus 100 analyzes the test processing data received from the test apparatus 100, and transmits information for performing a debugging process to the multichip system 200 via the TAP 210.

Then, after the chip 220-1 (CHIP 1) performs the debugging process, the chip 220-1 (CHIP 1) transmits response information RESPONSE to the test apparatus 100. Then, the chip 220-1 (CHIP 1) deactivates the test elements. As an example, the chip 220-1 (CHIP 1) may deactivate the test elements by obstructing power supply to the test elements.

The debugging of the chip 220-1 (CHIP 1) may be finished by performing the operation described above.

Then, in operation 5208, the test apparatus 100 transmits target ID information for selecting another chip to be tested to the multichip system 200 via the TAP 210. As an example, the test apparatus 100 may transmit ID information about a chip 220-2 (CHIP 2) to the multichip system 200 as target ID information.

Then, the chip 220-2 (CHIP 2) to which the target ID information is allocated activates the test elements, and then transmits response information RESPONSE to the test apparatus 100 in operation 5209. The other chips, to which the target ID information is not allocated, may not activate test elements, and may not generate response information RESPONSE.

Then, in operation 5210, the test apparatus 100 transmits the test data to the multichip system 200 via the set of TAP 210. Then, all of the plurality of the chips 220-1 through 220-N included in the multichip system 200 receive the test data. However, because only the test elements of the chip 220-2 (CHIP 2), to which the target ID information is allocated, are activated, only the test elements of the chip 220-2 (CHIP 2) process the test data.

In operation 5211, the chip 220-2 (CHIP 2) transmits test processing data, which corresponds to a result of processing the test data, to the test apparatus 100.

In operation 5212, the test apparatus 100 analyzes the test processing data received from the multichip system 200, and transmits information for performing a debugging process to the multichip system 200 via the set of the TAP 210.

Then, after the chip 220-2 (CHIP 2) performs the debugging process, the chip 220-2 (CHIP 2) transmits response information RESPONSE to the test apparatus 100 in operation 5213. Then, the chip 220-2 (CHIP 2) deactivates the test elements. As an example, the chip 220-2 (CHIP 2) may deactivate power supply to the test elements.

The debugging of the chip 220-1 (CHIP 1) may be finished by performing the operation described above. A debugging process may be sequentially performed with respect to chips 220-3 through 220-N−1 (CHIP 3 through CHIP N−1) by performing the same method.

Then, in operation 5214, the test apparatus 100 transmits target ID information for selecting another chip to be tested to the multichip system 200 via the TAP 210. As an example, the test apparatus 100 may transmit ID information about a chip 220-N (CHIP N) to the multichip system 200 as target ID information.

Then, the chip 220-N (CHIP N) to which the target ID information is allocated activates the test elements, and then transmits response information RESPONSE to the test apparatus 100 in operation 5213. The other chips, to which the target ID information is not allocated, may not activate test elements, and may not generate the response information RESPONSE.

Then, in operation 5216, the test apparatus 100 transmits the test data to the multichip system 200 via the TAP 210. Then, all of the plurality of chips 220-1 through 220-N included in the multichip system 200 receive the test data. However, because only the test elements of the chip 220-N (CHIP N), to which the target ID information is allocated, are activated, only the test elements of the chip 220-N (CHIP N) process the test data.

In operation 5217, the chip 220-N (CHIP N) transmits test processing data, which corresponds to a result of processing the test data, to the test apparatus 100.

In operation 5218, the test apparatus 100 analyzes the test processing data received from the multichip system 200, and transmits information for performing a debugging process to the multichip system 200 via the TAP 210.

Then, after the chip 220-N (CHIP N) performs a debugging process, the chip 220-N (CHIP N) transmits response information RESPONSE to the test apparatus 100 in operation 5219. The chip 220-2 (CHIP 2) deactivates the test elements after transmitting the response information RESPONSE to the test apparatus 100. As an example, the chip 220-N (CHIP N) obstructs power supply to the test elements.

Thus, a debugging process may be sequentially performed with respect to all of the plurality of chips 220-1 through 220-N included in the multichip system 200.

While the inventive concept has been particularly shown and described with reference to example embodiments thereof, it will be understood that various changes in form and details may be made therein without departing from the spirit and scope of the following claims.

What is claimed is:

1. A multichip system comprising:
a first chip comprising a first debugging port and first identification (ID) information;
a second chip comprising a second debugging port and second ID information; and
a test access port (a TAP) electrically connected to the first debugging port and the second debugging port, and configured to connect to a test apparatus via the TAP,
wherein the first chip and the second chip are configured to perform a debugging process based on a multi-drop method,
wherein the first chip and the second chip are arranged on a printed circuit board (a PCB),
the first chip comprises a first ID information port including a first plurality of terminals; and
the second chip comprises a second ID information port including a second plurality of terminals, and
a circuit on the PCB is configured to pull up or pull down the first ID information to the first plurality of terminals and the second ID information to the second plurality of terminals.

2. The multichip system of claim 1,
wherein the circuit on the PCB is configured to selectively connect each of the first plurality of terminals and the second plurality of terminals to a power terminal or a ground terminal to provide the first ID information to the first plurality of terminals and the second ID information to the second plurality of terminals.

3. The multichip system of claim 1, wherein the first chip and the second chip are configured to exchange data with the test apparatus via the TAP using a serial wired joint test action group (JTAG) protocol.

4. The multichip system of claim 1, wherein the TAP comprises a data input/output terminal and a clock terminal.

5. The multichip system of claim 1, wherein the TAP comprises a data input/output terminal and a clock terminal which are based on a serial wired joint test action group (JTAG) protocol, and
the data input/output terminal and the clock terminal are connected to the first debugging port and the second debugging port via a bus.

6. The multichip system of claim 1, wherein at least one among a programmable fuse and an erasable programmable read only memory (EPROM) is used to program the first ID information and the second ID information.

7. The multichip system of claim 1, wherein the first chip is configured to receive target ID information from the test apparatus and determine whether the first chip is to be tested based on the target ID information received from the test apparatus, and
the second chip is configured to receive the target ID information from the test apparatus and determine whether the second chip is to be tested based on the target ID information received from the test apparatus.

8. The multichip system of claim 1, wherein the first chip comprises:
a first joint test action group (JTAG) interface module configured to exchange data with the test apparatus according to a JTAG protocol;
a first ID register configured to store the first ID information; and
a first JTAG access control module configured to receive target ID information via the first JTAG interface module, control the first chip to process test data received from the test apparatus and output processed test data to the test apparatus via the first JTAG interface module based on whether the target ID information received via the first JTAG interface module is identical to the first ID information stored in the first ID register, and
the second chip comprises:
a second JTAG interface module configured to exchange data with the test apparatus according to the JTAG protocol;
a second ID register configured to store the second ID information; and
a second JTAG access control module configured to receive the target ID information via the second JTAG interface module, control the second chip to process test data received from the test apparatus and output processed test data to the test apparatus via the second JTAG interface module based on whether the target ID information received via the second JTAG interface module is identical to the second ID information stored in the second ID register.

9. The multichip system of claim 8, wherein if the target ID information received via the first JTAG interface module is not identical to the first ID information stored in the first ID register, the first JTAG access control module is configured to control elements of the first chip not to process the test data.

10. The multichip system of claim 1, wherein the TAP is directly connected to the first debugging port and the second debugging port.

11. A multichip debugging method comprising:
allocating first identification (ID) information to a first chip of a plurality of chips arranged on a printed circuit board (a PCB) and second ID information to a second chip of the plurality of chips;
receiving target chip ID information via a test access port (a TAP) electrically connected to a first debugging port of the first chip and a second debugging port of the second chip;
selecting one among the first chip and the second chip as a target chip to be tested based on the target chip ID information received via the TAP; and
performing a debugging process on the target chip,
wherein the first chip comprises a first ID information port including a first plurality of terminals,
the second chip comprises a second ID information port including a second plurality of terminals, and
the selecting the target chip comprises pulling up or pulling down the first ID information to the first plurality of terminals and the second ID information to the second plurality of terminals.

12. The multichip debugging method of claim 11, wherein the TAP comprises a data input/output terminal and a clock terminal which are based on a joint test action group (JTAG) protocol.

13. A chip comprising:
a debugging port configured to communicate with a test apparatus;
an ID information port including a plurality of terminals; and
a processor configured to compare ID information indicating a plurality of bits received via the debugging port with ID information identifying the chip, determine whether the received ID information indicates the chip based on the comparison, and control the chip to perform a debugging operation based on the determining,
wherein the chip is arranged on a printed circuit board (a PCB), and
a circuit on the PCB is configured to pull up or pull down the ID information identifying the chip to the plurality of terminals.

14. The chip of claim 13, further comprising a memory interface,
wherein the processor is further configured to activate the memory interface based on the received ID information indicating the chip.

15. The chip of claim 13, wherein the debugging port is configured to directly connect to the test apparatus.

* * * * *